(12) United States Patent
Heerman

(10) Patent No.: US 6,781,215 B2
(45) Date of Patent: Aug. 24, 2004

(54) INTERMEDIATE BASE FOR A SEMICONDUCTOR MODULE AND A SEMICONDUCTOR MODULE USING THE INTERMEDIATE BASE

(75) Inventor: Marcel Heerman, Merelbeke (BE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 09/997,345

(22) Filed: Nov. 29, 2001

(65) Prior Publication Data

US 2002/0070437 A1 Jun. 13, 2002

(30) Foreign Application Priority Data

Nov. 29, 2000 (DE) .......................................... 100 59 176

(51) Int. Cl.[7] .......................... H01L 29/40; H01L 23/04; H01L 23/48
(52) U.S. Cl. ........................ 257/621; 257/698; 257/735; 257/774
(58) Field of Search ...................... 257/618, 621–623, 257/672, 673, 676, 698, 735–738, 747, 773, 774, 777, 778, 780; 438/106–109, 123, 411, 461, 611, 613, 928

(56) References Cited

U.S. PATENT DOCUMENTS

| | | | |
|---|---|---|---|
| 4,682,270 A | 7/1987 | Whitehead et al. .......... 361/401 |
| 5,069,626 A | 12/1991 | Patterson et al. ............. 439/55 |
| 5,229,647 A | * 7/1993 | Gnadinger .................. 257/785 |
| 5,737,052 A | * 4/1998 | Kimura ....................... 349/149 |
| 5,760,469 A | 6/1998 | Higashiguchi et al. ...... 257/678 |
| 5,929,516 A | 7/1999 | Heerman et al. ............ 257/701 |
| 6,159,767 A | * 12/2000 | Eichelberger ................ 438/107 |
| 6,249,048 B1 | 6/2001 | Heerman et al. ............ 257/701 |
| 6,288,445 B1 | 9/2001 | Kimura ....................... 257/737 |

FOREIGN PATENT DOCUMENTS

| | | |
|---|---|---|
| EP | 0 782 765 | 6/2000 |
| GB | 2 349 014 | 10/2000 |
| JP | 4-133472 | * 5/1992 |
| JP | 2000-58594 | 2/2000 |
| WO | WO 89/00346 | 1/1989 |
| WO | WO 99/39021 | 8/1999 |

OTHER PUBLICATIONS

Jayaraj et al, "Liquid Crystal Polymers and Their Role in Electronic Packaging", *Advancing Microelectronics*, Jul./Aug. 1998, pp. 15–18.

* cited by examiner

*Primary Examiner*—Hung Vu
(74) *Attorney, Agent, or Firm*—Schiff Hardin LLP

(57) ABSTRACT

An intermediate base supports a semiconductor module on a printed circuit board. The intermediate base has an upper face on which the semiconductor component is directly mounted with its component connecting elements facing the upper face. The base has through-holes which are incorporated from a lower face of the base body so that the component conducting elements of the semiconductor component are exposed. The through-holes are then at least partially coated with a metal layer, which also contacts the exposed portions of the component connecting elements. Each of the through-holes has at least a partially annular notch, so that each through-hole extends through a recessed stud, which is used to form an external connection for the module onto the printed circuit board.

19 Claims, 2 Drawing Sheets

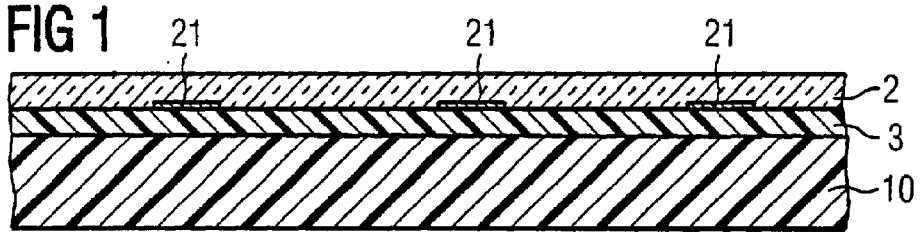
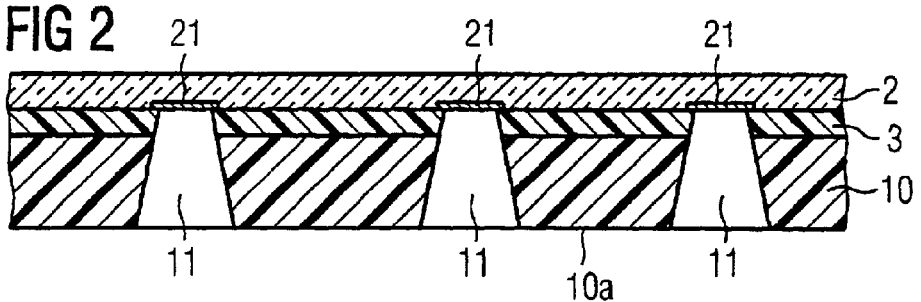
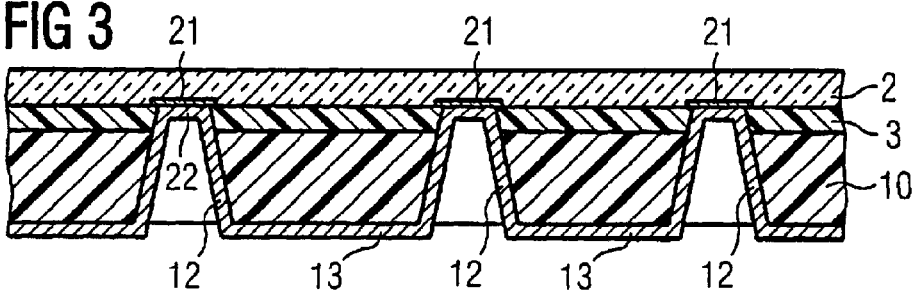
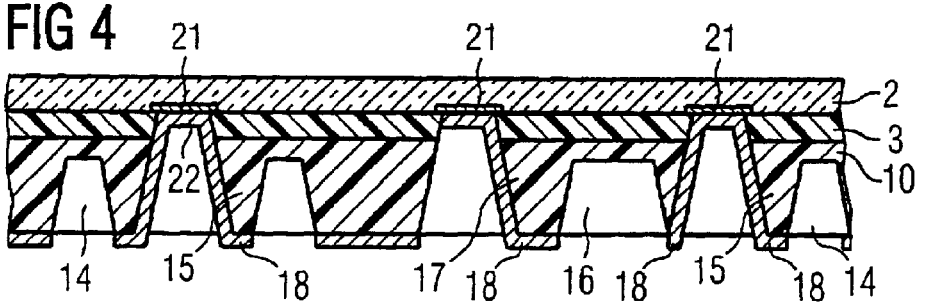

INTERMEDIATE BASE FOR A SEMICONDUCTOR MODULE AND A SEMICONDUCTOR MODULE USING THE INTERMEDIATE BASE

BACKGROUND OF THE INVENTION

The present invention relates to an intermediate base for a module having at least one semiconductor component. The base comprises a flat base body having an upper face on which internal connections are formed for connection to connecting elements of the semiconductor component, a lower face, which is provided with external connections for making contact with a circuit base, carrier or board and through-holes extending between the upper face and the lower face, whose walls are at least partially metallized to make connections between the internal connections on the upper face and the corresponding external connections on the lower face. The invention also relates to the semiconductor module produced using this intermediate base and to the method for producing the intermediate base.

The increasing miniaturization of integrated circuits has led to the problem that an even greater number of electrical connections need to be accommodated in a very confined space between the actual semiconductor and the circuit carrier or base, that is to say the printed circuit board. However, the finer the structures of the semiconductor chip and of the connecting conductors, the greater is the extent to which they are at risk from different expansion levels of the materials involved, in particular the semiconductor body and the printed circuit board, which is composed of plastic.

The intermediate base or interposer plays a great role in making contact with a semiconductor chip. It allows one or more chips to be connected to form a module, with which contact is then made on the circuit carrier or board.

In the case of what is referred to as a BGA (Ball Grid Array) technology, an intermediate base is provided over the area of its lower face with solder studs, which allow surface mounting on a printed circuit board. The solder studs are, in this case, first used as electrical connections and secondly are used as spacers to compensate for expansion between the different materials of the intermediate base and printed circuit board. The conductor chip can be mounted on the upper face of the intermediate base, and contact can be made with it, for example, by means of bonding wires. Flip chip mounting is also known, in which the connections of the unhoused semiconductor are directly connected to conductor tracks on the upper face of the intermediate base. In order to provide expansion compensation between the semiconductor body and the intermediate base in this case, underfilling is generally required for the semiconductor, which involves the necessity for additional, complicated and expensive processing steps, which also do not allow subsequent repair.

In the case of what is referred to as PSGA (Polymer Stud Grid Array) technology, the injection-molded, three-dimensional substrate composed of an electrically insulating polymer is used as the intermediate base, on whose lower face polymer studs are arranged over the surface, which are integrally formed during the injection molding process. Examples of this are shown in U.S. Pat. Nos. 5,929,516 and 6,249,048, whose disclosures are incorporated herein by reference thereto, and by the corresponding European Patent EP 0 782 765. These polymer studs are provided with an end surface which can be soldered and form external connections which are connected via integrated conductor runs to internal connections for the semiconductor component which is arranged on the substrate. The polymer studs are used as spacers for the module from a printed circuit board and are, thus, able to compensate for different expansion levels between the printed circuit board and the intermediate base. Contact can be made with the semiconductor component on the upper face of the intermediate base via bonding wires; however, a form of contact making is also feasible in which the different thermal coefficients of expansion are compensated for in an analogous manner via polymer studs on the upper face of the intermediate base.

In addition, a single-chip module is know from U.S. Pat. No. 5,069,626, whose disclosure is incorporated herein by reference thereto, and from WO 89/00346. As disclosed by these references the injection-molded three-dimensional substrate composed of an electrically insulating polymer has integrally formed polymer studs on the lower face which are arranged in one row or in a number of rows along the circumference of the substrate. One chip is arranged on the upper face of the substrate and contact is made with it via fine bonding wires and conductor tracks, which are then, themselves, connected via plated through-holes to the external connections formed on the lower-face studs. In this embodiment, the intermediate base has a relatively large extent.

SUMMARY OF THE INVENTION

The object of the present invention is to provide an intermediate base for a semiconductor module, a production method for forming the intermediate base and a module in which contact can be made directly with the semiconductor component without any underfilling on the intermediate base and contact can be made with the intermediate base on the circuit carrier or base without any additional measures, and in which the different coefficients of expansion of the materials that are used do not have any apparent disadvantageous effect. In this case, the semiconductor component together with the intermediate base are intended to produce a module with a very compact physical form.

According to the invention, the first part of the object is achieved by an intermediate base for a module having at least one semiconductor component. The base comprises a flat base body having an upper face on which internal connections are formed for connection to component connecting elements of a semiconductor component, a lower face, which is provided with external connections for making contact with a circuit carrier, and through-holes between the upper face and the lower face, whose walls are at least partially metallized, and each makes a conductive connection between a contact point on the upper face and a corresponding external connection on the lower face, with the walls of the through-holes being at least partially exposed in the region of the lower face of the base body by means of annular notches or grooves, which are incorporated adjacent to a circumferential edge of the through-hole and form a freestanding stud as the external connection.

The production of the stud by means of notches or grooves on the lower face of the intermediate base, as provided according to the invention, results in them being arranged recessed in the lower face surface and not projecting, or only their metallized layers project beyond the surface. Nevertheless, the studs are able to absorb and to compensate for temperature-dependent different expansion levels of the intermediate base, on the one hand, and on the circuit carrier or board, on the other hand. Contact is made via a short route through the metallized holes which run within the polymer stud to the upper face of the intermediate base, where the semiconductor component or else a number of semiconductor components is/are arranged, and contact is made with the internal connections.

The through-holes are preferably formed concentrically within the studs, so that the latter has a tubular or chimney-like configuration. However, an eccentric arrangement between the through-holes and the stud is also feasible, so that the latter approximately has the form of a tubular segment.

A particularly compact construction can be achieved if the intermediate base according to the invention is formed by a film composed of a plastic material, whose coefficient of expansion is approximately the same as that of the semiconductor component, which is generally silicon. In this case, the semiconductor component can be placed with its component connecting elements directly onto the internal connections on the upper face of the through-holes and can make contact therewith. This means that no connecting conductors whatsoever in the form of bonding wires or conductor tracks are required on the upper face of the intermediate base. Compensation for different thermal coefficients of expansion is then essentially required only between the intermediate base and the circuit carrier or board, and this compensation is provided via the polymer studs, which are provided according to the invention in the lower face area of the intermediate base.

A film composed of LCP (Liquid Crystal Polymer) or a material with similar thermal expansion characteristics is highly suitable for use as a material for the intermediate base. This material is described, for example, in an article in *Advancing Microelectronics*, July/August 1998, pages 15–18.

In a more preferred refinement, the external connecting elements are formed by a metal layer on the outer rim of the studs, which is in the form of a continuation of the metallization of the through-hole. This can be provided with an additional solder layer and the through-holes in the interior of the studs can also be filled with solder material.

In one particularly advantageous refinement of the invention, the internal connections are each only in the form of a continuation of the metallization of the inner walls of the through-hole, and this continuation covers the upper face opening of the respective through-hole. In this case, the metallization layer which forms the internal connection is applied directly to the component connecting elements of the already-fitted semiconductor component through the through-holes from the lower face of the intermediate base.

The method according to the present invention for producing a connecting base of at least one semiconductor component comprises the steps of the connecting side of the semiconductor component is fixed on an upper surface of a flat base body so that its component connections rest on the upper face of the base body, through-holes are drilled through the base body from the lower face as far as the upper face in order to expose the component connecting elements of the semiconductor component, the inner walls of the through-holes and the exposed contact surfaces of the semiconductor component are coated with a metal layer at the same time as at least part of the lower face of the base body, and the rim of the holes on the lower face of the base body is at least partially exposed by means of a circumferential notch.

The annular notches for exposing the hole rims are preferably produced in the same way as the holes for the through-holes, by means of a laser processing. In this case, further laser structuring for a conductor track structure can be carried out at the same time on the lower face of the base body. During this processing step, those metal surfaces which are not required are removed and the remaining metal surfaces may be provided with an additional metal layer. In order to produce a greater thickness, additional solder layers, such as tin-lead, can be applied to these metal structures for soldering, so that there is no need for a process of paste printing.

However, a somewhat different method sequence is also feasible in which the studs on the lower face of the base body are produced even before the connection to the semiconductor component. In this case, the studs can be produced both by laser structuring and by stamping on the lower face of the base body. In this case, the semiconductor component would be fitted onto the base body provided with the studs, and the drilling of the through-holes would then be carried out from the lower face through the already preformed studs to the upper face of the base body, followed by a subsequent metallization.

Other advantages and features of the invention will be readily apparent from the following description of the preferred embodiments, the drawings and claims.

BRIEF DESCRIPTION OF THE DRAWINGS

FIGS. 1–4 are cross-sectional views showing individual steps of producing the intermediate base with a semiconductor component, with FIG. 1 being a cross-sectional view after the component is connected on the base; FIG. 2 being a cross-sectional view showing the arrangement after forming the through-holes; FIG. 3 being a cross-sectional view of the arrangement after applying the metallizing layer; and FIG. 4 being a cross-sectional view of the arrangement after forming the notches;

DESCRIPTION OF THE PREFERRED EMBODIMENTS

Figure 6:
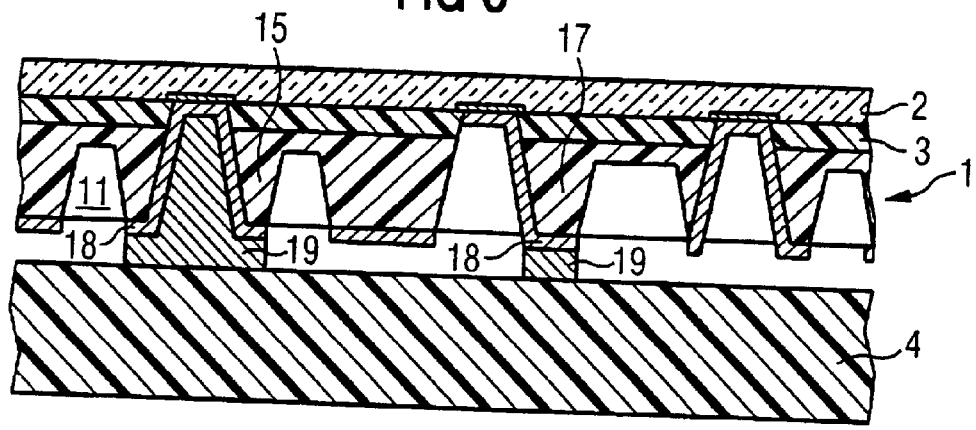
FIG. 6 is a cross-sectional view showing a mounting of the semiconductor module according to the present invention on a printed circuit board.

The principles of the present invention are particularly useful when incorporated in an intermediate base, generally indicated at 1 in FIG. 6, which supports a semiconductor component, such as a chip 2, on a printed circuit board 4.

To produce the intermediate base 1, a base body 10, which is formed from a LCP film with a similarly low coefficient of expansion to that of the semiconductor component is utilized. As is known, the thermal coefficient of expansion of LCP is similar to that of silicon, so that such a base body can be connected directly to the semiconductor without any risk of different expansion when subjected to thermal loads. As shown in FIG. 1, the base body 10 is connected via an intermediate adhesive layer 3 to a semiconductor chip 2, whose component connecting elements are in the form of metal pads 21 that face the base body 10. The adhesive layer 3 may have a thickness of 25 $\mu$m to 50 $\mu$m, for example, while the LCP film which forms the base body 10 may, for example, have a thickness of 100 $\mu$m to 200 $\mu$m. It is also feasible to use a multilayer film for the base 10 and a conductor track structure can also be provided between the layers of the base 10.

In a second processing step shown in FIG. 2, through-holes 11 are drilled from the lower face 10a of the base body to the upper face of the base body 10, to be precise, so that they each meet one of the flat component connecting elements 21. These connecting elements 21 are thus exposed. The drilling process is carried out using a laser drilling method with the laser beam being set so that the component connecting element 21 is not removed.

After forming the through-holes 11, the inner walls of the through-holes 11 are provided entirely or at least partially with a metal layer 12, and this metal layer is also deposited on the exposed component connecting element 21 without any discontinuity. The semiconductor chip 2 thus makes direct contact with the intermediate base. The application of the metallization 12 also allows the other areas of the lower face 10a of the base body 10 to be entirely or partially covered with a metal layer.

As illustrated in FIG. 4, annular notches or grooves 14 are now incorporated around each of the through-holes 11, which produce chimney-like studs 15, which are arranged recessed in the base body 10, so that they do not project beyond the lower face 10a. The rims of the studs are already covered with the metal layer 12, as a result of the previous metallization process, and can thus be used directly as external connections for making contact on a printed circuit board. The depth of the notches 14 is governed by the required thermal load capacity, since these studs 15 can now absorb and compensate for the loads that occur in the event of different thermal expansion of the intermediate base 1 with the semiconductor chip 2 seated on it and with the printed circuit board.

Figure 5:
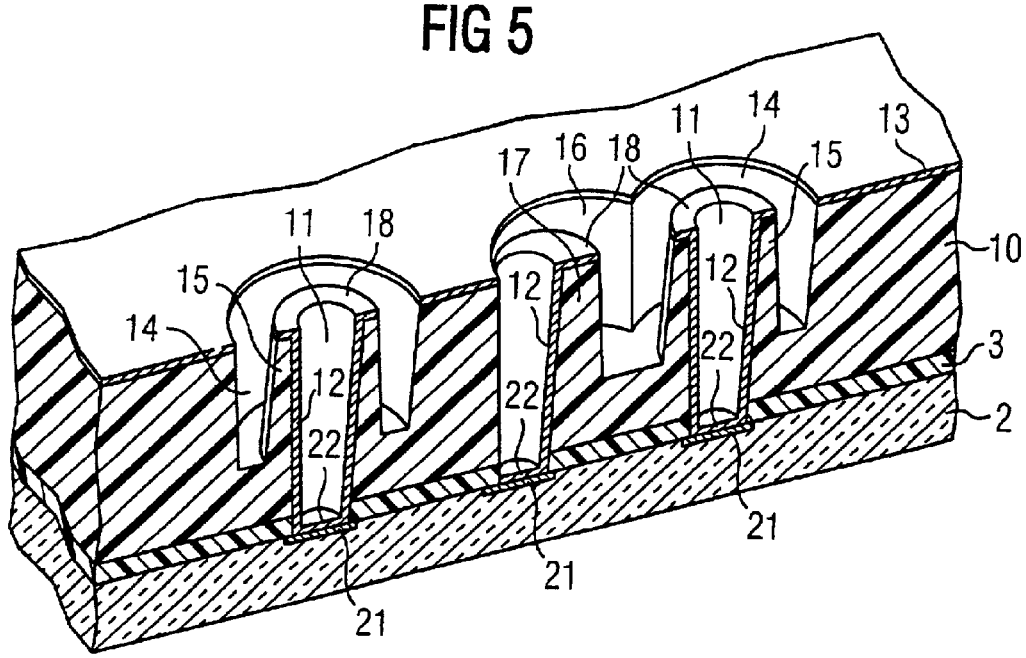
FIG. 5 is a perspective view with portions broken away for purposes of illustration of a cutaway intermediate base.

The notches 14 are ideally arranged concentrically with respect to the through-holes 11, so that the studs 15 have a symmetrically tubular shape. However, it is also feasible, for specific reasons or as a result of dimensional discrepancies, for a notch 16 (FIG. 4) to be located eccentrically with respect to the corresponding through-hole 11, thus resulting in a stud 17 which is cut on one side, in the form of an annular segment (see FIGS. 4 and 5).

At the same time that the notches 14 are incorporated, a desired conducting structure can also be produced on the lower face of the base body 10 by laser processing during the same processing step. In this case, the metal surfaces which are not required can be removed and the remaining metal surfaces can be provided with an additional metal coating. Solder materials can be applied to the rims of the studs, which are used as external contacts 18, in order, in particular, to achieve a greater metal thickness.

As illustrated in FIG. 6, the invention makes contact with an intermediate base 1 and a semiconductor chip 2 on a printed circuit board 4, with the external contacts 18 each being reinforced by a solder layer 19 composed of tin-lead. FIG. 6 also shows that the tin-lead alloy 19 may fill one of the through-holes 11.

Although various minor modifications may be suggested by those versed in the art, it should be understood that I wish to embody within the scope of the patent granted hereon all such modifications as reasonably and properly come within the scope of my contribution to the art.

I claim:

1. An intermediate base for a module having at least one semiconductor component, said base comprising a flat base body having an upper face on which internal connections are formed for connection to connecting elements of a semiconductor component, a lower face which is provided with external connections for making contact with a circuit carrier, said base body being a film composed of plastic material whose coefficient of expansion is approximately the same as the coefficient of expansion of the semiconductor component and having through-holes between the upper face and the lower face, said through-holes having walls of said plastic material being at least partially metallized to make a conductive connection between each internal connection on the upper face and a corresponding external connection on the lower face, the walls of the through-holes being at least partially exposed in the region of the lower face of the base body by means of annular notches which are incorporated adjacent to a circumferential edge of the through-holes to form freestanding studs as external connections, said studs having an outer rim in the plane of the lower face.

2. The intermediate base according to claim 1, wherein annular notches are concentric to form tubular studs.

3. The intermediate base according to claim 1, wherein at least one of the notches is eccentric so that the stud associated therewith is approximately in the form of a tubular segment.

4. The intermediate base according to claim 1, wherein the film is composed of liquid crystal polymer.

5. The intermediate base according to claim 1, wherein the external connections are in the form of metal layers on the outer rim of the studs.

6. The intermediate base according to claim 5, wherein the external connecting elements have an additional solder layer.

7. The intermediate base according to claim 5, wherein the through-holes are at least partially filled with a solder material.

8. The intermediate base according to claim 1, wherein the internal connection is a portion of a metal layer of the metallized through-hole.

9. A semiconductor module comprising a semiconductor chip and an intermediate base, said intermediate base having a flat base body of a plastic material having an upper face on which internal connections are formed for connection to connecting elements of the semiconductor chip, the semiconductor chip being secured on the upper face with the connecting elements directly engaging the internal connections, said flat base body having a lower face which is provided with external connections for making contact with a circuit carrier, and through-holes extending between the upper face and the lower face, each of said through-holes having a wall of the plastic material which wall is at least partially metallized for making a conductive connection between an internal connection on the upper face and a corresponding external connection on the lower face, the wall of each of the through-holes being at least partially exposed in the region of the lower face of the base body by means of annular notches which are incorporated adjacent a circumferential edge of the through-hole to form a freestanding stud as an external connection.

10. The semiconductor module according to claim 9, wherein the semiconductor chip is secured on the upper face by a thin layer of adhesive material.

11. A semiconductor module comprising a semiconductor component and an intermediate base, said intermediate base having a flat base body in the form of a film composed of a plastic material having a coefficient of expansion approximately the same as a coefficient expansion of the semiconductor component, said base body having an upper face on which internal connections are formed for connection to connecting elements of the semiconductor component, the semiconductor component being connected directly with the upper face of the base body so that the connecting elements rest directly on the internal connections, said flat base body having a lower face which is provided with external connections for making contact with a circuit carrier, said base body having through-holes extending in each case directly between one of the internal connections on the upper face and an external connection on the lower face, each of said through-holes having a wall which is at least partially metallized for making a conductive connection between an internal connection on the upper face and a corresponding external connection on the lower face and the wall of each of the through-holes being at least partially exposed in the region of the lower face of the base body by means of annular notches which are incorporated adjacent a circumferential edge of the through-hole to form a free-standing stud as the external connection.

12. The semiconductor module according to claim 11, wherein the base body is connected to the semiconductor component via an adhesive layer.

13. The semiconductor module according to claim 11, wherein the annular notches are concentric to form tubular studs.

14. The semiconductor module according to claim 11, wherein at least one of the notches is eccentric so that the stud associated therewith is approximately in the form of a tubular segment.

15. The semiconductor module according to claim 11, wherein the film is composed of a liquid crystal polymer.

16. The semiconductor module according to claim 11, wherein the external connections are in the form of metal layers on an outer rim of the studs.

17. The semiconductor module according to claim 16, wherein the external connections have an additional solder layer.

18. The semiconductor module according to claim 11, wherein the through-holes are at least partially filled with a solder material.

19. The semiconductor module according to claim 11, wherein the connecting elements of the semiconductor component are metal pads which are contacted by the internal connection, which is a metal film layer of the metallized through-hole.

* * * * *